United States Patent [19]
Seko et al.

[11] Patent Number: 5,253,265
[45] Date of Patent: Oct. 12, 1993

[54] SEMICONDUCTOR LASER DEVICE

[75] Inventors: Yasuji Seko; Kiichi Ueyanagi; Hideo Nakayama; Hideki Fukunaga; Nobuaki Ueki, all of Kanagawa, Japan

[73] Assignee: Fuji Xerox Co., Ltd., Tokyo, Japan

[21] Appl. No.: 832,053

[22] Filed: Feb. 6, 1992

[30] Foreign Application Priority Data

Feb. 7, 1991 [JP] Japan ................ 3-036540

[51] Int. Cl.$^5$ .................................. H01S 3/19
[52] U.S. Cl. .......................... 372/46; 372/45
[58] Field of Search ................ 372/45, 46, 50

[56] References Cited

U.S. PATENT DOCUMENTS 4,727,556  2/1988  Burnham et al. .............. 372/50

OTHER PUBLICATIONS

D. G. Deppe, et al., "Buried heterostructure $Al_xGa_{1-x}$As-GaAs quantum well lasers by Ge diffusion from the vapor", Appl. Phys. Lett. 52(10), Mar. 7, 1988, pp. 825–827.

Primary Examiner—James W. Davie
Attorney, Agent, or Firm—Finnegan, Henderson, Farabow, Garrett & Dunner

[57] ABSTRACT

A semiconductor laser device having an active layer which is comprised of a quantum well layer formed of a mixed crystal material, and barrier layers provided on both sides of the quantum well layer in such a manner as to sandwich the same, is characterized in that Ge is thermally diffused in a portion of the active layer to disorder the quantum well layer and the barrier layers at that portion so as to form a non-light-emitting area with a low refractive index, while the quantum well layer and the barrier layers at a portion where Ge is not diffused is formed as a refractive index waveguide which is a light-emitting area.

8 Claims, 4 Drawing Sheets

SEMICONDUCTOR LASER DEVICE

BACKGROUND OF THE INVENTION

The present invention relates to a semiconductor laser device having an active layer which is comprised of a quantum well layer made of a mixed crystal material, and barrier layers provided on both sides of the quantum well layer in such a manner as to sandwich the same, and more particularly to improvements of a semiconductor laser device to attain higher efficiency and a shorter wavelength.

Among the wavelength bands which have hitherto been used extensively in semiconductor laser devices, the 800 nm-level band using pure GaAs as an active layer has been dominant. The laser light of this wavelength band, however, has the drawback that the light is utterly invisible to a human eye. In addition, in a case where such a semiconductor laser device is applied as a light source for a photosensitive member of an optical disk or of a laser printer, there has been a demand for attaining a shorter wavelength and rendering the laser light visible to meet requirements for a higher density of the optical disk and to conform with the photosensitive characteristics of the photoreceptor (particularly organic photoreceptor).

In order to attain a shorter wavelength for the output light of a semiconductor laser device, it suffices if the band gap of the light-emitting portion (active layer) is widened, and the following two methods are conceivable as methods therefor. One is a method in which a crystalline material of an active layer is disordered into a mixed crystal (e.g. GaAs →AlGaAs). According to this method, the 700 nm-level laser light can be obtained, and semiconductor laser devices having a wavelength in the vicinity of 780 nm have been made available as products. The other method is one in which the gap between quantization levels contributing to light emission is widened by reducing the thickness of the active layer to the neighborhood of not more than a level (about 200 Å) where the quantum size effect appears (i.e., formation of the quantum well).

Active studies have been undertaken with respect to the latter method since this method is also effective in attaining the high efficiency of the laser light by increasing the effective state density of electrons and holes which contributes to the light emission. If the thickness of the active layer is too small, however, the stability and reliability against the heat treatment of impurity-induced disordering, which will be described later, become deteriorated, so that the thickness which is considered to be practicable is over about 100 Å. Accordingly, in order to attain a sufficiently short wavelength and high efficiency, the joint use of the disordering of the active layer and the formation of the quantum well is desirable, so that the aforementioned active layer is conventionally comprised of a quantum well layer constituted by a mixed crystal material and barrier layers provided on both sides of the quantum well layer in such a manner as to sandwich the same.

Meanwhile, in attaining the higher efficiency of the semiconductor laser device, current restriction and light confinement in the lateral direction in the active layer are required, and various structures as means therefor have been proposed and put to practical use. As an effective means among them, a method using impurity-induced disordering is known. This is a method in which impurities such as Si and Zn are caused to be thermally diffused at a portion other than a light emitting portion from the surface of a crystal-growing layer for a laser device, and mutual diffusion between a quantum well layer at that portion and barrier layers disposed respectively on the upper and lower surfaces thereof is induced so as to perform disordering. The current is restricted in that area by means of this diffusion, and the band gap of the quantum well layers at that portion expands, with the result that the refractive index becomes small and light confinement becomes possible.

A conventional semiconductor laser device will be described hereafter for a case where Si is used as the diffusion impurity. As shown in FIG. 5, an n-type cladding layer c, an n-type barrier layer d, a quantum well layer e of GaAs, a p-type barrier layer d', a p-type cladding layer c', and a p-type cap layer f of GaAs for preventing the oxidation of the p-type cladding layer are consecutively formed as films on an n-type GaAs substrate a. Then, as shown in FIG. 6, Si is diffused in a portion other than a light-emitting portion from a surface of the cap layer until Si sufficiently crosses the quantum well layer e, thereby inducing the disordering between the quantum well layer e and the upper and lower barrier layers d, d'. As a result, since the band gap of the quantum well layer e at this portion expands, the carriers (electrons, holes) cease to be injected into this portion, so that the light-emitting portion g is restricted, thereby contributing to the improvement of the light emission efficiency. At the same time, since the laser light is confined, the high efficiency of the semiconductor laser device is made possible. It should be noted that, as shown in FIG. 7, the conventional semiconductor laser device is arranged such that a p-type electrode h is formed on the p-type cap layer f, and an n-type electrode b is formed on the n-type GaAs substrate a.

However, since heat treatment at high temperature for a long time duration, such as at 850° C. and for 10 hours, is required for the diffusion of the aforementioned Si, in a case where the quantum well layer e is made of mixed crystal of AlGaAs obtained by mixing Al to attain a shorter wavelength, mutual diffusion between the quantum well layer e and the barrier layers d, d' located on and underneath the same is greatly accelerated owing to the aforementioned heat treatment, so that there have been cases where the quantum well layer e and the barrier layers d, d' located on and underneath the same are mixed even at the light-emitting portion g where Si was not diffused. Then, if the quantum well layer e and the barrier layers d, d' are mixed, there have been problems in that the configuration of the quantum well layer changes and the emission efficiency declines, and that the wavelength shifts from a targeted wavelength further toward the short-wavelength side. It should be noted that, in a case where Zn is used instead of the aforementioned Si, heat treatment at high temperature for a long time duration can be made less stringent; however, the diffusion distance of Zn becomes difficult to be controlled, so that its application has been difficult.

SUMMARY OF THE INVENTION

The present invention has been made in view of the above-described problems, and its object is to provide a semiconductor laser device whose wavelength does not shift from a targeted wavelength toward the short-wavelength side, and which is capable of attaining high efficiency and a shorter wavelength.

A semiconductor laser device of the present invention includes an active layer which is comprised of a quantum well layer formed of a mixed crystal material, and barrier layers provided on both sides of the quantum well layer in such a manner as to sandwich the same, and is characterized in that Ge is thermally diffused in a portion of the active layer to disorder the quantum well layer and the barrier layers at that position so as to form a non-light-emitting area with a low refractive index, while the quantum well layer and the barrier layers at a position where Ge is not diffused is formed as a refractive index waveguide which is a light-emitting area.

In such a technical means, the aforementioned quantum well layer means a thin film layer formed to a thickness not more than a level (about 200 Å) where the quantum size effect (i.e., the effect whereby it is possible to attain a shorter wavelength and higher efficiency of the output light, which is caused by confinement of electrons and holes in potential wells formed by conduction band ends and valence band ends having a shorter width than the de Broglie wavelength of electrons and holes) appears. For instance, thin film layers composed of such mixed crystal materials as AlGaAs, GaInP, and AlGaIn fall within the quantum well layer.

It should be noted that this technical means, in addition to being applicable to a semiconductor laser device having a single light-emitting point, is also naturally applicable to a semiconductor laser device having a plurality of light-emitting points.

According to the present invention, instead of Si requiring heat treatment at high temperature for a long time duration and Zn whose diffusion distance is difficult to be controlled, Ge whose diffusion distance is easily controlled and whose heat treatment conditions are less stringent is used as the diffusion impurity, and Ge is thermally diffused in a portion of the active layer to disorder the quantum well layer and the barrier layers at that portion so as to form a non-light-emitting area with a low refractive index, while the quantum well layer and the barrier layers at a portion where Ge is not diffused is formed as a refractive index waveguide which is a light-emitting area, so that it becomes possible to prevent the mixing of the quantum well layer at the portion where Ge is not diffused and the barrier layers located on and underneath the same at the time of heat treatment.

DETAILED DESCRIPTION OF THE INVENTION

Figure 1:
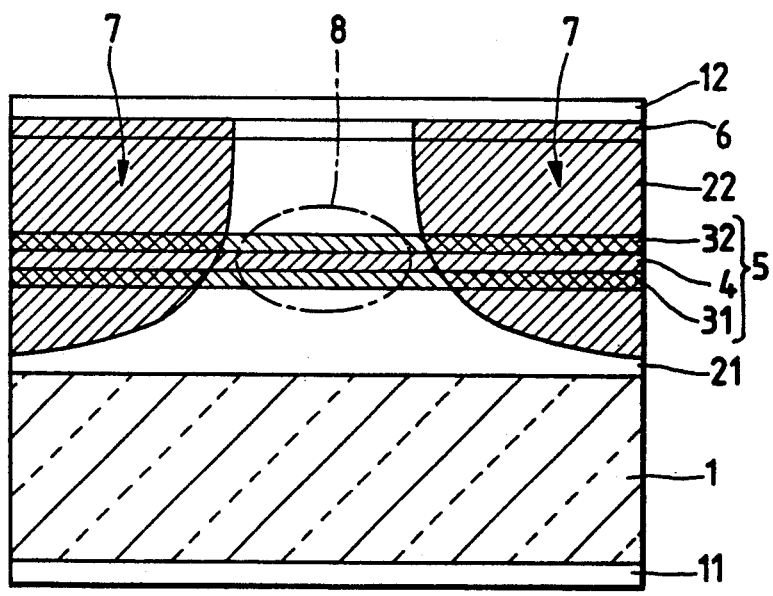
FIG. 1 is a cross-sectional view of a semiconductor laser device in accordance with a first embodiment.

Referring to the drawings, a detailed description will be given hereafter of the embodiments of the present invention.

FIRST EMBODIMENT

As shown in FIG. 1, a semiconductor laser device in accordance with the first embodiment comprise an n-type GaAs substrate 1 having an n-side electrode 11 on its reverse surface; a 1 $\mu$m-thick cladding layer 21 which is composed of n-type $Al_{0.7}Ga_{0.3}As$ and laminated on the substrate 1 via a 0.2 $\mu$m-thick buffer layer (not shown) composed of n-type $Al_{0.3}Ga_{0.7}As$; a 2000 Å-thick barrier layer 31 which is composed of $Al_{0.3}Ga_{0.7}As$, has a large band gap, and is laminated on the cladding layer 21 to constitute a part of an active layer 5; a 100 Å-thick quantum well layer 4 composed of $Al_{0.1}Ga_{0.9}As$ and laminated on the barrier layer 31 to constitute a part of the active layer 5; a 2000 Å-thick barrier layer 32 which is composed of $Al_{0.3}Ga_{0.7}As$, has a large band gap, and is laminated on the quantum well layer 4 to constitute a part of the active layer 5; a 1 $\mu$m-thick cladding layer 22 which composed of n-type $Al_{0.7}Ga_{0.3}As$ and laminated on the barrier layer 32; a p-type GaAs cap layer 6 laminated on this cladding layer 22 and designed to prevent the oxidation of the cladding layer 22 having a high Al composition ratio and to establish ohmic contact; and a p-side electrode 12 disposed on this cap layer 6. In addition, Ge is thermally diffused under the conditions of 830° C. for 3 hours in both ends of the respective n-type cladding layer 21, barrier layer 31, quantum well layer 4, barrier layer 32, p-type cladding layer 22, and the cap layer 6 so as to effect disordering through Ge, thereby forming a non-light-emitting area 7. Meanwhile, the quantum well layer 4 and the barrier layers 31, 32 at a portion where Ge is not diffused forms a refraction index waveguide which is a light-emitting area 8.

Here, electrons and holes are vertically confined in the quantum well layer 4 which constitutes a part of the active layer 5, and light-emission recombination is liable to occur. In addition, the active layer 5 is sandwiched by the pair of cladding layers 21, 22, and has the effect of confining the light vertically.

Meanwhile, the area where Ge has been thermally diffused is a disordered area, and has a high Al composition ratio, so that the band gap energy is greater than that of the quantum well layer 4. Accordingly, since the "turn on voltage" at which the current begins to flow is high in this area, this area has the effect of restricting the current in the lateral direction. In addition, since the refractive index of this area is smaller than those of the quantum well layer 4 and the barrier layers 31, 32, this area also has the light confinement effect, and therefore plays the role of an optical waveguide.

Accordingly, the semiconductor laser device in accordance with this embodiment has the advantages that high emission efficiency due to the effects of current restriction and light confinement is obtained, and that it is possible to attain a reduction in power consumption and a decline in the amount of heat generated in the active layer 5.

Moreover, instead of Si requiring heat treatment at high temperature for a long time duration and Zn whose diffusion distance is difficult to be controlled, Ge whose diffusion distance is easily controlled and whose heat treatment conditions are less stringent is used as the diffusion impurity. Thus, it becomes possible to prevent the mixing of the quantum well layer 4 at the portion where Ge is not diffused and the barrier layers 31, 32 located on and underneath the same at the time of heat treatment. Accordingly, there is an advantage in that the wavelength band does not shift from a targeted wavelength to the shorter wavelength side.

Figure 2:
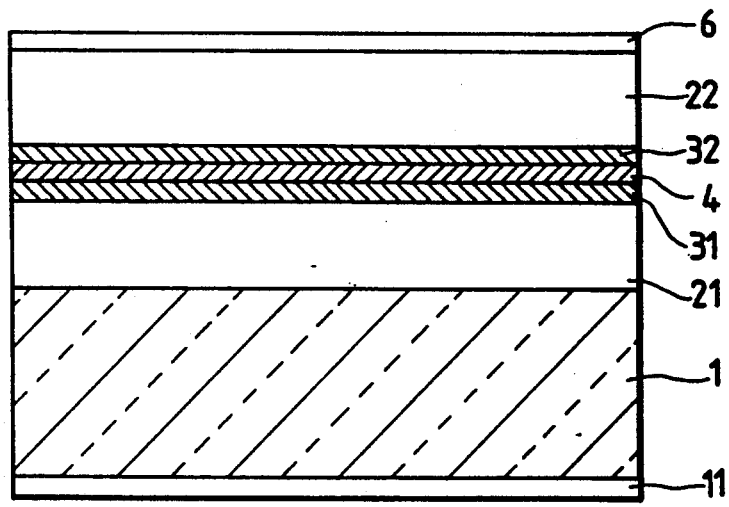
FIG. 2 is a cross-sectional view of the semiconductor laser device in the process of manufacture in accordance with the first embodiment.

Next, a description will be given of the process of manufacturing the semiconductor laser device in accordance with this embodiment. First, as shown in FIG. 2, the buffer layer (not shown) composed of n-type $Al_{0.3}Ga_{0.7}As$ is laminated on the n-type GaAs substrate 1 by means of MOCVD (metal organic chemical vapor deposition) method so as to improve its crystallinity. Then, the cladding layer 21 composed of n-type $Al_{0.7}Ga_{0.3}As$, the barrier layer 31 composed of $Al_{0.3}Ga_{0.7}As$, the quantum well layer 4 composed of $Al_{0.1}Ga_{0.9}As$, the barrier layer 32 composed of $Al_{0.3}Ga_{0.7}As$, the cladding layer 22 composed of p-type $Al_{0.7}Ga_{0.3}As$, and the p-type GaAs cap layer 6 are consecutively laminated thereon using the same method. Further, 1000 Å-thick $Si_3N_4$ (not shown) is formed uniformly on the aforementioned p-type cap layer 6 by means of a sputtering method.

Figure 3:
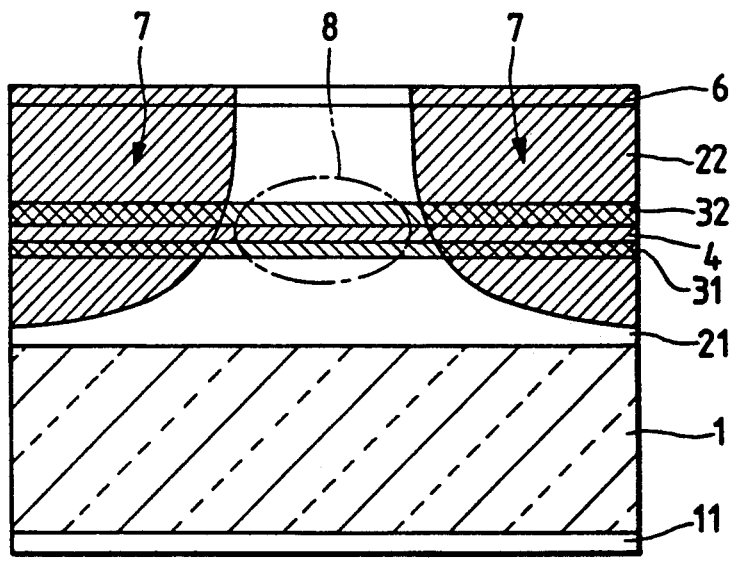
FIG. 3 is a cross-sectional view of the semiconductor laser device in the process of manufacture in accordance with the first embodiment.

Next, after photolithography/dry etching processing is conducted to provide the SiN$_4$ layer with pattern, by using this as a mask, Ge is thermally diffused, as shown in FIG. 3, to effect the impurity-induced disordering of the area other than the light-emitting area 8, thereby forming the non-light-emitting area 7.

The thermal diffusion and disordering processing was conducted by vacuum-sealing in a silica tube the unfinished device with the respective layers laminated, Ge, and As which promotes the thermal diffusion of Ge, and under heating conditions of 830° C. for 3 hours.

Then, after the aforementioned mask was removed, Zn was diffused from the surface of the cap layer 6 to convert to the p-type the surface area which become n-type due to the diffusion of Ge, and then the p-type electrode 12 was formed. Finally, the n-type electrode 11 was formed on the side of the n-type GaAs substrate 1, thereby obtaining the semiconductor laser device shown in FIG. 1.

The Zn diffusion processing described above was conducted by placing in a carbon-made box the unfinished device with Ge diffused therein, Zn, and Ga for lowering the melting point of Zn by forming a Zn-Ga alloy, and by holding them in a hydrogen atmosphere at 600° C. for 20 minutes.

SECOND EMBODIMENT

The semiconductor laser device in accordance with this embodiment is substantially identical with the semiconductor laser device in accordance with the first embodiment except that two light-emitting areas are provided.

Figure 4:
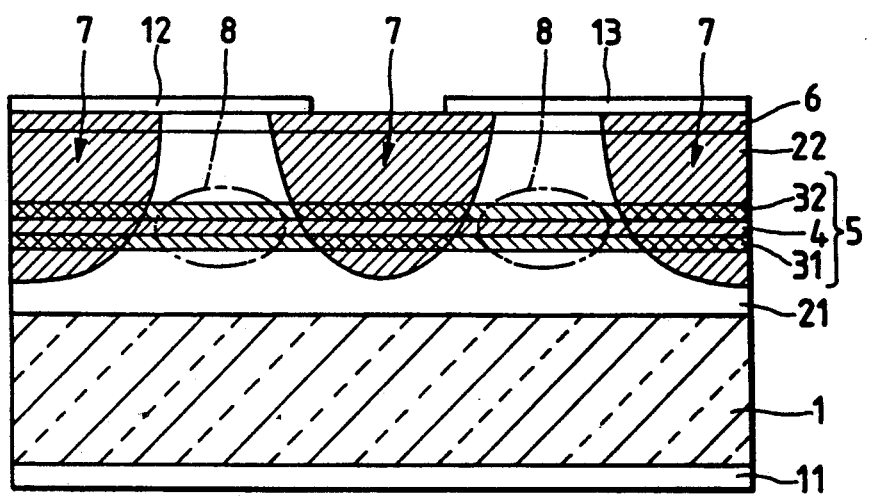
FIG. 4 is a cross-sectional view of the semiconductor laser device in accordance with a second embodiment.
Figure 5:
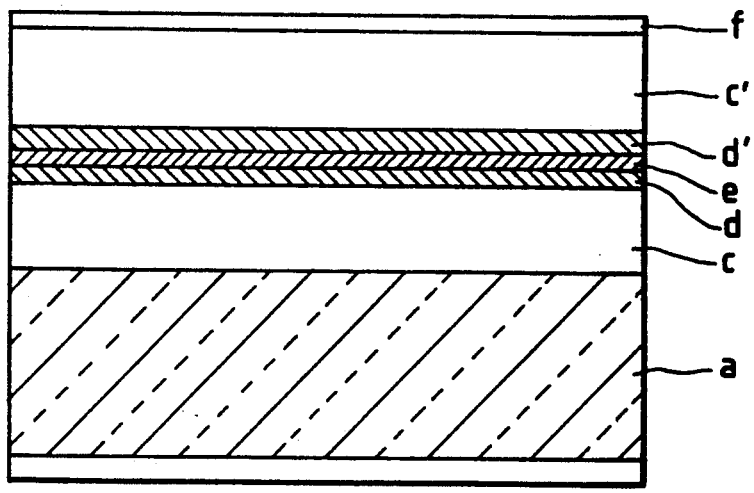
FIG. 5 is a cross-sectional view of a conventional semiconductor laser device in the process of manufacture.
Figure 6:
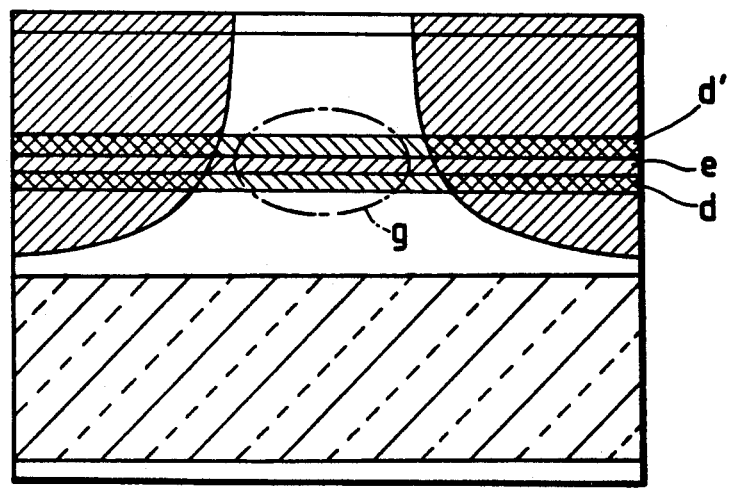
FIG. 6 is a cross-sectional view of the conventional semiconductor laser device in the process of manufacture.
Figure 7:
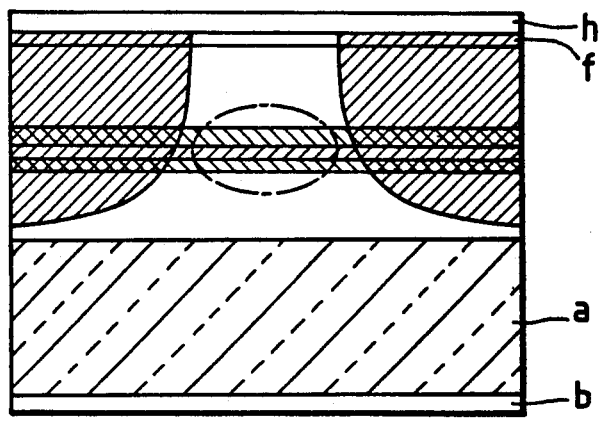
FIG. 7 is a cross-sectional view of the conventional semiconductor laser device.

That is, as shown in FIG. 4, the semiconductor laser device in accordance with this embodiment comprise an n-type GaAs substrate 1 having an n-side common electrode 11 on its reverse surface; a 1 μm-thick cladding layer 21 which is composed of n-type $Al_{0.7}Ga_{0.3}As$ and laminated on the substrate 1 via a 0.2 μm-thick buffer layer (not shown) composed of n-type $Al_{0.3}Ga_{0.7}As$; a 2000 Å-thick barrier layer 31 which is composed of $Al_{0.3}Ga_{0.7}As$, has a large band gap, and is laminated on the cladding layer 21 to constitute a part of an active layer 5; a 100 Å-thick quantum well layer 4 composed of $Al_{0.1}Ga_{0.9}As$ and laminated on the barrier layer 31 to constitute a part of the active layer 5; a 2000 Å-thick barrier layer 32 which is composed of $Al_{0.3}Ga_{0.7}As$, has a large band gap, and is laminated on the quantum well layer 4 to constitute a part of the active layer 5; a 1 μm-thick cladding layer 22 which is composed of p-type $Al_{0.7}Ga_{0.3}As$ and laminated on the barrier layer 32; a p-type GaAs cap layer 6 laminated o this cladding layer 22 and designed to prevent the oxidation of the cladding layer 22 having a high Al composition ratio and to establish ohmic contact; and p-side individual electrodes 12, 13 disposed on this cap layer 6. In this device, Ge is thermally diffused under the conditions of 830° C. and 3 hours in both ends and in the center of the respective n-type cladding layer 21, barrier layer 31, quantum well layer 4, barrier layer 32, p-type cladding layer 22, and the cap layer 6 so as to effect disordering through Ge, thereby forming three non-light-emitting areas 7, 7, 7. Meanwhile, the quantum well layer 4 and the barrier layers 31, 32 at portions where Ge is not diffused forms two refraction index waveguides which are light-emitting areas 8, 8.

The interval between the two light-emitting areas 8, 8 mentioned above is 10 μm in terms of a center-to-center distance.

In the same way as the first embodiment, the semiconductor laser device in accordance with this embodiment has advantages in that its emission efficiency is high due to the current restriction and light confinement effects, that a reduction in power consumption and a decline in the amount of heat generated in the active layer 5 can be attained, and thermal crosstalk between the multibeam of light is reduced in conjunction with a decline in the amount of heat generated.

Moreover, since Ge whose heat treatment conditions are less stringent is used as the diffusion impurity, it becomes possible to prevent the mixing of the quantum well layer 4 at the portion where Ge is not diffused and the barrier layers 31, 32 located on and underneath the same at the time of heat treatment. Thus, there is an advantage in that the wavelength band does not shift from a targeted wavelength to the shorter wavelength side.

It should be noted that although, in both the first and second embodiments, the mixed crystal material of AlGaAs is used as the quantum well layer, a mixed crystal material of GaInP may be used instead of AlGaAs, so that the present invention may be applied to the semiconductor laser device having a wavelength of 600 nm level. Furthermore, Al may be added to the same to obtain AlGaInP, so that the present invention may be applied to the semiconductor laser device having a further short wavelength.

THIRD EMBODIMENT

In order to examine the relation between the diffusion distance of Ge into AlGaAs crystal and the diffusion time, diffusion experiments of Ge into crystals were conducted under the following conditions.

Figure 8:
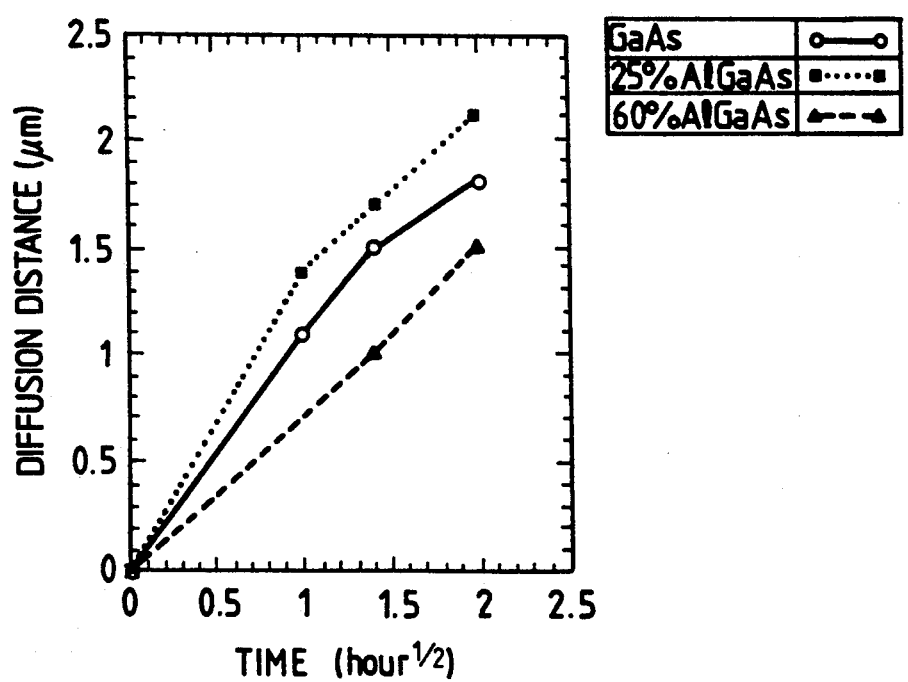
FIG. 8 is a graph showing relation between diffusion distance and diffusion time of Ge.

A sample (7 mm square) of p-type GaAs doped with Mg of 6 to $9 \times 10^{17}$ cm$^{-3}$ and a Ge diffusion source (7 mm square) composed of a GaAs substrate and 650 Å thick Ge layer provided on the GaAs substrate were inserted in an ampule of quartz. Then, the relation between the diffusion time and diffusion distance of Ge into the GaAs crystal under the conditions of diffusion temperature of 830° C. and As pressure of 1.3 atm was examined. The results are shown by marks of o in FIG. 8. Also, for samples of 25% AlGaAs and 60% AlGaAs, the relation between the diffusion time and the diffusion distance of Ge into the AlGaAs crystals were examined. The results are shown by marks of ■ for 25% AlGaAs and ▲ for 60% AlGaAs in FIG. 8.

As to the diffusion of Si atoms, "J. Appl. Phys 64 (12), 1988, P93-P113" reports that when Si atoms are diffused under the conditions of diffusion temperature of 800° C. and diffusion time of 25 hours, the diffusion depth into GaAs bulk crystal is about 1.2 $\mu$m under As pressure of 1.3 atm. In the present invention, a time in which a diffusion distance of Ge reaches 1.2 $\mu$m under the substantially same conditions as those set forth above, is about 1.2 ($1.1^2$) hours from FIG. 8. Thus, it is confirmed that when Ge is diffused, a diffusion time can be reduced as compared with Si. Also, the above publication reports that under the conditions of diffusion temperature of 800° C., diffusion time of 25 hours and As pressure of 1.3 atoms, the diffusion depth of Si into $Al_xGa_{1-x}As$ (X=0.5) crystal is about 2.0 $\mu$m. In the present invention, Ge diffusion speed into 60% AlGaAs under the substantially same conditions as those set forth above, is about 1.5 $\mu$m for 4 hours, and the relation is linear. Accordingly, also from these data, it is confirmed that diffusion time of Ge can be reduced as compared with Si.

Conventionally, there is no example in which Ge diffusion is applied to a quantum well type laser having a quantum well layer of mixed crystal material. When a mixed crystal material is used as the quantum well layer, mutual diffusion of atoms is apt to occur due to heat treatment. Thus, the quantum well is apt to be damaged during thermal diffusion of impurities at the heat treatment. Accordingly, impurities such as Ge which can lower the temperature of heat treatment and the diffusion time, are effective.

According to the present invention, instead of Si requiring heat treatment at high temperature for a long time duration and Zn whose diffusion distance is difficult to be controlled, Ge whose diffusion distance is easily controlled and whose heat treatment conditions are less stringent is used as the diffusion impurity, so that it becomes possible to prevent the mixing of the quantum well layer at the portion where Ge is not diffused and the barrier layers located on and underneath the same at the time of heat treatment.

Accordingly, there are advantages in that the emission efficiency of the semiconductor laser device in accordance with the present invention is high, and that the wavelength band does not shift from a targeted wavelength to the shorter wavelength side.

What is claimed is:

1. A semiconductor laser device, comprising:
   an active layer including a quantum well layer made of a mixed crystal material and barrier layers provided on both sides of said quantum well layer; and
   cladding layers provided on both sides of said active layer so as to sandwich said active layer;
   said active layer having a region containing Ge, and said quantum well layer and said barrier layers in said region being disordered by said Ge.

2. A semiconductor laser device as claimed in claim 1, wherein said cladding layers have portions thereof containing e and contacting said active layer region.

3. A semiconductor laser device as claimed in claim 1, further comprising a substrate provided on one of said cladding layers, and an oxidation preventing layer provided on the other of said cladding layers.

4. A semiconductor laser device as claimed in claim 3, further comprising a first electrode provided on said substrate, and a second electrode provided on said oxidation preventing layer.

5. A semiconductor laser device, comprising:
   an active layer including a quantum well layer made of a mixed crystal material and barrier layers provided on both sides of said quantum well layer; and
   cladding layers provided on both sides of said active layer so as to sandwich said active layer;
   said active layer having a plurality of regions containing Ge, and said quantum well layer and said barrier layers in said plurality of regions being disordered by said Ge.

6. A semiconductor laser device as claimed in claim 5, wherein said cladding layers have portions thereof containing Ge and contacting said active layer regions.

7. A semiconductor laser device as claimed in claim 5, further comprising a substrate provided on one of said cladding layers, and an oxidation preventing layer provided on the other of said cladding layers.

8. A semiconductor laser device as claimed in claim 7, further comprising a first electrode provided on said substrate, and a plurality of second individual electrodes provided on said oxidation preventing layer.

* * * * *

UNITED STATES PATENT AND TRADEMARK OFFICE
CERTIFICATE OF CORRECTION

PATENT NO. : 5,253,265
DATED : October 12, 1993
INVENTOR(S) : Yasuji Seko et al.

It is certified that error appears in the above-indentified patent and that said Letters Patent is hereby corrected as shown below:

Claim 2, column 8, line 20, change "e" to --Ge--.

Signed and Sealed this

Sixteenth Day of August, 1994

Attest:

BRUCE LEHMAN

*Attesting Officer*  *Commissioner of Patents and Trademarks*